(12) United States Patent
Sato et al.

(10) Patent No.: US 6,583,198 B2
(45) Date of Patent: *Jun. 24, 2003

(54) PHOTO CURABLE RESIN COMPOSITION AND PHOTOSENSITIVE ELEMENT

(75) Inventors: Kuniaki Sato, Ibaraki-ken (JP); Hiroaki Hirakura, Ibaraki-ken (JP); Toshihiko Ito, Ibaraki-ken (JP); Takao Hirayama, Ibaraki-ken (JP); Toshizumi Yoshino, Ibaraki-ken (JP)

(73) Assignee: Hitachi Chemical Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,333

(22) Filed: Nov. 24, 1998

(65) Prior Publication Data

US 2001/0003759 A1 Jun. 14, 2001

(30) Foreign Application Priority Data

Nov. 28, 1997 (JP) ............................................. 9-329294

(51) Int. Cl.$^7$ ............................. G03F 7/028; C08J 3/28; C08L 63/10
(52) U.S. Cl. ...................... 522/100; 522/101; 522/102; 522/103; 522/111; 430/5; 430/286.1; 430/288.1
(58) Field of Search .................................. 522/100, 101, 522/102, 103, 109, 110, 111, 134, 135–147, 129, 146; 430/286.1, 287.1, 288.1, 5

(56) References Cited

U.S. PATENT DOCUMENTS

| | | | | |
|---|---|---|---|---|
| 3,535,403 A | * | 10/1970 | Holub | |
| 4,174,218 A | * | 11/1979 | Pohl | |
| 4,177,074 A | * | 12/1979 | Proskow | 430/286.1 |
| 4,517,279 A | * | 5/1985 | Worns | |
| 4,628,022 A | * | 12/1986 | Ors et al. | 430/280.1 |
| 4,948,700 A | * | 8/1990 | Maeda et al. | 430/280.1 |
| 5,053,316 A | * | 10/1991 | Suzuki et al. | |
| 5,539,064 A | * | 7/1996 | Hashimoto et al. | 525/529 |
| 5,677,398 A | * | 10/1997 | Motoshima et al. | 525/531 |
| 5,849,460 A | * | 12/1998 | Kawai et al. | 430/280.1 |
| 6,015,651 A | * | 1/2000 | Awaji et al. | |

FOREIGN PATENT DOCUMENTS

| | | |
|---|---|---|
| DE | 3925895 A | 2/1990 |
| EP | 0306273 A | 3/1989 |
| EP | 0539606 A | 5/1993 |
| EP | 0623852 A | 11/1994 |
| EP | 0663411 A | 7/1995 |
| EP | 0795788 A | 9/1997 |
| JP | 2-43551 | 2/1990 |
| JP | 3-172317 | 7/1991 |
| JP | 3-253092 | 11/1991 |
| JP | 8-139457 | 5/1996 |
| JP | 9-136931 | 5/1997 |
| JP | 9-258442 | 10/1997 |
| JP | 10-147762 | 6/1998 |
| JP | 10-195403 | 7/1998 |

* cited by examiner

Primary Examiner—Susan W. Berman
(74) Attorney, Agent, or Firm—Antonelli, Terry, Stout & Kraus, LLP (57) ABSTRACT

A photo curable resin composition, which comprises (A) an acid-modified, vinyl group-containing epoxy resin, (B) an elastomer, (C) a photopolymerization initiator, (D) a diluent and (E) a curing agent, can gives a high performance cured film having distinguished heat resistance, humidity-heat resistance, adhesibility, mechanical characteristics and electrical characteristics, and a photosensitive element, which comprises a support and a layer of the photo curable resin composition laid on the support, has distinguished heat resistance, humidity-heat resistance, adhesibility, mechanical characteristics and electrical characteristics.

9 Claims, 1 Drawing Sheet

PHOTO CURABLE RESIN COMPOSITION AND PHOTOSENSITIVE ELEMENT

BACKGROUND OF THE INVENTION

The present invention relates to a photo curable resin composition and more particularly to a photo curable resin composition for use as a permanent mask resist with distinguished pattern formability, heat resistance, adhesibility, mechanical characteristics chemical resistance, electrical characteristics, etc. in the electronic materials such as a solder resist for printed wiring boards, an interlayer insulating film in a high density multilayered board, a solder resist for semiconductor packages, etc. and a photosensitive element using the same.

In the production of printed wiring boards, permanent mask resists have been so far produced by screen printing a heat or ultraviolet ray curing type, resist ink. With the recent trend toward higher integration of electronic devices, more precise wiring patterns and insulation patterns are required in the printed wiring boards, but resist pattern formation by the conventional screen printing has had a difficulty in forming more precise resist patterns owing to generation of exudation, sagging, etc. during the printing. To overcome the difficulty, resist pattern formation by photolithography has been proposed. Specifically, resist patterns are formed by thermocompressing a dry film type, photosensitive resist onto a substrate or curtain or spray coating a liquid photosensitive resist onto a substrate, followed by irradiation of actinic beam such as ultraviolet ray, etc., through a negative type mask and development. The dry film type, photosensitive resist is liable to involve air during the thermocompression onto the substrate to form foams, thereby lowering adhesibility or disturbing the resist pattern, with a fear of lowered resist performance. On the other hand, the liquid photosensitive resist has two types, i.e. solvent developing type and alkali developing type, but the alkali developing type is now dominant from the viewpoints of working environment friendliness and global environment friendliness, as disclosed in JP-A-51-243869 and JP-A-1-141904, where to improve the heat resistance, chemical resistance and electrical characteristics of coating films exposure to ultraviolet ray or heating is further conducted, thereby promoting crosslinking reaction.

However, the conventional liquid photosensitive resist still has problems in practical characteristics such as a humidity-heat resistance and heat resistance. That is, the alkali developing type, liquid photosensitive resist comprises the main component having hydrophilic groups to enable alkali development, and it is presumed that this makes it easy to permeate a chemical solution, water, etc. therethrough, thereby lowering the practical characteristic of resist film.

With the recent trend toward smaller sizes, lighter weight and higher performance of electronic equipment, semiconductor packages of smaller size and higher pin counts are now practically available and their massproduction is in progress. Semiconductor packages such as BGA (ball grid array), CSP (chip size package), etc. particularly require a PCT resistance (resistance to pressure cooker test), which may be called humidity-heat resistance, from the viewpoint of higher reliability. However unfortunately it is in the current situation that the conventional liquid photosensitive resist can withstand such severe conditions only for a few hours to a few tens of hour. Furthermore, with the recent trend toward changing the packaging method from the insert packaging to surface packaging, packaging temperature becomes higher and higher. Specifically, in the case of surface packaging, a cream solder is printed on desired regions in advance, and then the entirety is heated by infrared ray to reflow and set the solder, where the attainable temperature of package inside and outside will be considerably high, for example, 220° to 240° C. Thus, the conventional liquid photosensitive resist has a problem of the so called lowered reflow resistance, for example, generation of cracks on the coating film due to thermal shock or peeling of the coating film from the substrate or sealing material, and thus its improvement has been desired.

BRIEF SUMMARY OF THE INVENTION

An object of the present invention is to provide a photo curable resin composition capable of giving a cured film of higher performance with distinguished heat resistance, humidity-heat resistance, adhesibility, mechanical characteristics and electrical characteristics and suitable for use in the production of printed wiring boards, high density multilayered boards, semiconductor packages, etc.

A photo curable resin composition according to the present invention comprises (A) an acid-modified, vinyl group-containing epoxy resin, (B) an elastomer, (C) a photo polymerization initiator, (D) a diluent and (E) a curing agent.

The present invention further provides a photosensitive element, which comprises a support and a layer of the photo curable resin composition laid on the support. Cured film of the resin composition is distinguished in the heat resistance, humidity-heat resistance, adhesibility, mechanical characteristics and electrical insulatability.

DETAILED DESCRIPTION OF THE INVENTION

The present photo curable resin composition comprises (A) an acid-modified, vinyl group-containing epoxy resin, (B) an elastomer, (C) a photo polymerization initiator, (D) a diluent and (E) a curing agent.

The photo curable resin composition is characterized in that the elastic modulus of cured film of the composition is 1 to 100 MPa in dynamic visco-elasticity measurement in a range of 200° to 220° C.

The present photosensitive element comprises a support and a layer of the said photo curable resin composition laid on the support.

Acid-modified, vinyl group-containing epoxy resin for use in the present invention as Component (A) is an epoxy resin modified by a vinyl group-containing monocarboxylic acid, preferably resin obtained by reaction of at least one epoxy resin (a) selected from the group consisting of novolak type epoxy resin represented by the following formula (I), bisphenol A type epoxy resin or bisphenol F type epoxy resin represented by the following formula (II) and salicylaldehyde type epoxy resin represented by the following formula (III) with a vinyl group-containing monocarboxylic acid (b).

where X is a hydrogen atom or a glycidyl group; R is a hydrogen atom or a methyl group; and n is an integer of 1 or more, preferably 2 to 100.

In the present photo curable resin composition, acid-modified vinyl group-containing epoxy resin (A) can undergo crosslinking reaction (curing reaction) by ultraviolet ray or heat and thus is subject to distortion due to curing shrinkage (internal stress), suffering from lowering of flexibility and adhesibility as a problem. By adding a flexible elastomer (B) thereto, the stress on the cured film can be lessened to improve the cured coating film. In the present invention, an acid-modified, vinyl group-containing epoxy resin (A) and an elastomer (B) are used together to make a polymer alloy therefrom, thereby improving the curing shrinkage and flexibility of cured film, lowering the elastic modulus to 1–100 MPa in the dynamic visco-elasticity measurement in a range of 200° to 220° C., which is a reflow temperature, and improving the adhesive shear strength to a sealant. That is, when the elastic modulus is less than 1 MPa, the mechanical strength will be lowered, whereas above 100 MPa the adhesive shear strength will be lowered.

Acid-modified, vinyl group-containing epoxy resin (A) for use in the present invention includes, besides the reaction product (A') of the said epoxy resin (a) with vinyl group-containing monocarboxylic acid (b), reaction products (A'') obtained by further reaction of the said reaction product (A') with a saturated group or unsaturated group-containing polybasic acid anhydride (C). In case of these reaction products, specifically it seems that hydroxyl group is formed by the first reaction, i.e. addition reaction of the epoxy group of epoxy resin (a) with the carboxyl group of vinyl group-containing monocarboxylic acid (b) and the resulting hydroxyl group (including hydroxyl groups originally present in the epoxy resin (a)) and the acid anhydride group of saturated group or unsaturated group-containing polybasic acid anhydride (c) undergo semiesterification reaction by the second reaction.

Novolak type epoxy resin represented by the formula (I) includes phenol novolak type epoxy resin and cresol novolak type epoxy resin, which can be obtained by reaction of phenol novolak resin and cresol novolak resin with epichlorohydrin, respectively.

Bisphenol A type epoxy resin and bisphenol F type epoxy resin represented by the formula (II), whose X is a glycidyl group, can be obtained by reaction of the hydroxyl group of bisphenol A type epoxy resin and bisphenol F type epoxy resin represented by the following formula (IV) with epichlorohydrin. To promote the reaction of the hydroxyl group with epichlorohydrin, it is preferable to carry out the reaction at a reaction temperature of 50° to 120° C. in the presence of an alkali metal hydroxide in a polar organic solvent such as dimethylformamide, dimethylacetamide, dimethyl sulfoxide, etc. When the reaction temperature is below 50° C., the reaction will be retarded, whereas above 120° C. many side reaction will occur unpreferably.

where R is a hydrogen atom or a methyl group and n is an integer of 1 or more.

Salicylaldehyde type epoxy resin represented by the formula (III) includes specifically FAE-2500, EPPN-501H, EPPN-502H (which are tradenames of products commercially available from Nippon Kayaku Co., Ltd., Japan), etc.

Vinyl group-containing monocarboxylic acid (b) for use in the present invention includes, for example, acrylic acid, acrylic acid dimer, methacrylic acid β-furfurylacrylic acid, β-styrylacrylic acid, cinnamic acid, crotinic acid, α-cyanocinnamic acid, etc., and furthermore a semiesterified compound, which is a reaction product of hydroxyl group-containing acrylate and saturated or unsaturated dibasic acid anhydride and a semi-esterified compound, which is a reaction product of vinyl group-containing monoglycidyl ether or vinyl group-containing monoglycidyl ester and saturated or unsaturated dibasic acid anhydride. These semiesterified compound can be obtained by reaction of hydroxyl group-containing acrylate, vinyl group-containing monoglycidyl ether or vinyl group-containing monoglycidyl ester with saturated or unsaturated dibasic acid anhydride in an equimolar ratio. These vinyl group-containing monocarboxylic acids (b) can be used alone or in combination of two or more thereof.

Hydroxyl group-containing acrylate, vinyl group-containing monoglycidyl ether and vinyl group-containing monoglycidyl ester for use in the synthesis of the said semi-esterified compound as one example of vinyl group-containing monocarboxylic acid include, for example, hydroxyethyl acrylate, hydroxyethyl methacrylate, hydroxypropyl acrylate, hydroxypropyl methacrylate, hydroxybutyl acrylate, hydroxybutyl methacrylate, polyethyleneglycol monoacrylate, polyethylene glycol monomethacrylate, trimethylolpropane diacrylate, trimethylolpropane dimethacrylate, pentaerythritol triacrylate, pentaerythritol trimethacrylate, dipentaerythritol pentacrylate pentaerythritol pentamethacrylate, glycidyl acrylate, glycidyl methacrylate, etc.

Saturated or unsaturated dibasic acid anhydride for use in the synthesis of the said semi-esterified compound includes; for example, succinic anhydride, maleic anhydride, tetrahydrophthalic anhydride, phthalic anhydride, methyltetrahydrophthalic anhydride, ethyltetrahydrophthalic anhydride, hexahydrophthalic anhydride, methylhexahyhdrophthalic anhydride, ethylhexahydrophthalic anhydride, itaconic anhydride, etc.

Reaction of epoxy resin (a) with vinyl group-containing monocarboxylic acid (b) according to the present invention, is carried out in a ratio of vinyl group-containing monocarboxylic acid (b) to the epoxy group of epoxy resin (a) by equivalent weight of preferably 0.8–1.05:1, more preferably 0.9–1.0:1.

Epoxy resin (a) and vinyl group-containing monocarboxylic acid (b) is subjected to reaction upon dissolution into an organic solvent. The organic solvent for this purpose includes, for example, ketones such as ethyl methyl ketone, cyclohexanone, etc.; aromatic hydrocarbons such as toluene, xylene, tetramethylbenzene, etc.; glycol ethers such as methyl cellosolve, butyl cellosolve, methyl carbitol, butyl carbitol, propyleneglycol monomethyl ether, dipropyleneglycol monoethyl ether, dipropyleneglycol diethyl ether, triethyleneglycol monoethyl ether, etc.; esters such as ethyl acetate, butyl acetate, butyl cellosolve acetate, carbitol acetate, etc.; aliphatic hydrocarbons such as octane, decane, etc.; petroleum solvents such as petroleum ether, petroleum naphtha, hydrogenated petroleum naphtha, solvent naphtha, etc.; and the like.

It is preferable to use a catalyst to promote the reaction. Catalyst for this purpose includes, for example, triethylamine, benzylmethylamine, methyltriethylammonium chloride, benzyltrimethylammonium chloride, benzyltrimethylammonium bromide, benzyltrimethylammonium iodide, triphenylphosphine, etc. The catalyst is used in an amount of preferably 0.1 to 10 parts by weight on the basis of 100 parts by weight of sum total of epoxy resin (a) and vinyl group-containing monocarboxylic acid (b).

To prevent polymerization during the reaction, it is preferable to use a polymerization inhibitor. The polymerization inhibitor includes, for example, hydroquinone, methylhydroquinone, hydroquinone monomethyl ether, catechol, pyrogallol, etc. and is used in an amount of preferably 0.01 to 1 part by weight on the basis of 100 parts by weight of sum total of epoxy resin (a) and vinyl group-containing monocarboxylic acid (b). Reaction temperature is preferably 60° to 150° C., more preferably 80° to 120° C.

If required, the vinyl group-containing monocarboxylic acid (b) can be used together with a polybasic acid anhydride such as trimellitic anhydride, pyromellitic anhydride, benzophenonetetracarboxylic anhydride, biphenyltetracarboxylic anhydride, etc.

The acid-modified, vinyl group-containing epoxy resin (A) for use in the present invention includes resins obtained by reacting the said reaction product (A') with a saturated group or unsaturated group-containing polybasic acid anhydride (c).

Saturated group or unsaturated group-containing polybasic acid anhydride (c) includes, for example, succinic anhydride, maleic anhydride, tetrahydrophthalic anhydride, methyltetrahydrophthalic anhyhdride, ethyltetrahydrophthalic anhydride, methylhexahydrophthalic anhydride, ethylhexahydrophthalic anhydride, itaconic anhydride, etc.

In the reaction of reaction product (A') with saturated group or unsaturated group-containing polybasic acid anhydride (c), 0.1 to 1.0 equivalent weight of the saturated group or unsaturated group-containing polybasic acid anhydride (c) is made to react with one equivalent weight of the hydroxyl group of reaction product (A'), whereby the acid value of the acid-modified, vinyl group-containing epoxy resin (A) can be adjusted. The acid value of acid-modified, vinyl group-containing epoxy resin (A) is preferably 30 to 150 mgKOH/g, more preferably 50 to 120 mgKOH/g. When the acid value is below 30 mgKOH/g, solubility of photo-curable resin composition in a dilute alkali solution will be lowered, whereas above 150 mgKOH/g the electrical characteristics of cured film will be lowered.

Reaction temperature for the reaction of reaction product (A') with saturated group or unsaturated group-containing polybasic acid anhydride (c) is preferably 60° to 120° C.

For example, hydrogenated bisphenol A type epoxy resin as epoxy resin (a) and resins of styrene-maleic acid series such as hydroxyethyl acrylate-modified, styrene-maleic anhydride copolymer, etc. can be partially used.

Elastomer (B) for use in the present invention includes, for example, styrene-based elastomers, olefinic elastomer, urethane-based elastomers, polyester-based elastomers, polyamide-based elastomers, acrylic elastomers and silicone-based elastomers. The elastomer (B) is composed of a hard segment component and a soft segment component, where the hard segment component generally contributes to heat resistance and strength, whereas the soft segment component generally contributes to flexibility and toughness.

Styrene-based elastomer includes, for example, styrene-butadiene-styrene block copolymer, styrene-isoprenestyrene block copolymer, styrene-ethylene-butylene-styrene block copolymer and styrene-ethylene-propylene-styrene block copolymer. Besides styrene as a constituent of the styrene-based elastomer, a styrene derivative such as α-methylstyrene, 3-methylstyrene, 4-propylstyrene, 4-cyclohexylstyrene, etc. can be used. Specifically, the styrene-based elastomer includes TAFUPLEN, SORUPLEN T, ASALEN and TAFUTEC (all the foregoing are tradenames of products commercially available from Asahi Chemical Industry Co., Ltd., Japan), ELASTOMER AR (tradename of a product commercially available from Aron Kasei Co., Ltd., Japan), CLAYTON G and PERREFLEX (all the foregoing are tradenames of products commercially available from Shell Japan Co., Ltd., Japan), JSR-TR, TSR-SIS and DYNARON (all the foregoing are tradenames of products commercially available from Japan Synthetic Rubber Co., Ltd., Japan), DENKA STR (tradename of a product commercially available from Denki Kagaku Kogyo K.K., Japan), QEENTACK (tradename of a product commercially available from Japanese Geon Co., Ltd., Japan), TPE-SB series (tradenames of products commercially available from Sumitomo Chemical Co., Ltd., Japan), RUBERON (tradename of a product commercially available from Mitsubishi Chemical Corp., Japan), SEPTON and HYPLAR (all the foregoing are tradenames of products commercially available from Kuraray Co., Ltd., Japan), SUMIFLEX (tradename of a product commercially available from Sumitomo Bakelite Co., Ltd., Japan), RHEOSTOMER and ACTIMER (all the foregoing are tradenames of products commercially available from Riken Vinyl Industry Co., Ltd., Japan), etc.

Olefinic elastomer is copolymers of α-olefins having 2 to 20 carbon atoms such as ethylene, propylene, 1-butene, 1-hexene, 4-methyl-pentene, etc., and includes, for example, ethylene-propylene copolymer (ERR), ethylene-propylene-diene copolymer (EPDM), etc. It also includes a-olefin copolymers with nonconjugated dienes having 2 to 20 carbon atoms such as dicyclopentadiene, 1,4-hexadiene, cyclooctadiene, methylenenorbornene, ethylidenenorbornene, butadiene, isoprene, etc., and also includes carboxyl-modified NBR, i.e. butadiene-acrylonitrile copolymer copolymerized with methacrylic acid. It includes, specifically ethylene-α-olefin copolymer rubber, ethylene-α-olefin-nonconjugated diene copolymer rubber, propylene-αolefin copolymer rubber, butene-α-olefin copolymer rubber, etc., and more specifically includes MIRASTOMER (tradename of a product commercially available from Mitsui Petrochemical Industries, Ltd., Japan), EXACT (tradename of a product commercially available from Exxon Chemical Corp., USA), ENGAGE (trademark of a product commercially available from Dow Chemical Co., USA), hydrogenated styrene-butadiene rubber "DYNABON HSBR" (trademark of a product commercially available from Japan Synthetic Rubber Co., Ltd., Japan), butadiene-acrylonitrile copolymers "NBR series" (tradenames of products commercially available from Japan Synthetic Rubber Co., Ltd., Japan), butadiene-acrylonitrile copolymers modified at both ends with carboxyl groups having crosslinking sites "XER series" (tradenames of products commercially available from Japan Synthetic Rubber Co., Ltd., Japan), etc.

Urethane-based elastomer is composed of two structural units, i.e. hard segments consisting of low polymer glycol and diisocyanate and soft segments consisting of high polymer (long chain) diol and diisocyanate. High polymer (long chain) diol includes, for example, polypropyleneglycol, polytetramethylene oxide, poly(1,4-butylene adipate), poly (ethylene-1,4-butylene adipate), polycaprolactone, poly(1,6-hexylene carbonate), poly(1,6-hexylene-neopentylene adipate), etc. The high polymer (long chain) diol has a number-average molecular weight of preferably 500 to 10,000. Besides ethyleneglycol, short chain diols such as propyleneglycol, 1,4-butanediol, bisphenol A, etc. can be also used. The short chain diol has a number-average molecular weight of preferably 48 to 500. The urethane-based elastomer includes specifically Pandex T-2185 and T-2983N (all the foregoing are tradenames of products commercially available from Dainippon Ink and Chemicals, Inc., Japan), Silactone E790, etc.

Polyester-based elastomer includes polycondensation products of dicarboxylic acid or its derivative and diol compound or its derivative. Dicarboxylic acid includes specifically aromatic dicarboxylic acids such as terephthalic acid, isophthalic acid, naphthalenedicarboxylic acid, etc., aromatic dicarboxylic acids, hydrogen atom of aromatic nuclei is substituted by a methyl group, an ethyl group, a phenyl group, etc., aliphatic dicarboxylic acids having 2 to 20 carbon atoms such as adipic acid, sebacic acid, dodecanedicarboxylic acid, etc., alicyclic dicarboxylic acids such as cyclohexanedicarboxylic acid, etc., and the like. These compounds can be used alone or in combination of two or more thereof. Diol compound includes specifically aliphatic diols and alicyclic diols such as ethyleneglycol, 1,3-propanediol, 1,4-butanediol, 1,6-hexanediol, 1,10-decanediol, 1,4-cyclohexanediol, etc., and also dihydric phenols represented by the following formula (V):

(V)

where Y is selected from alkylene groups having 1 to 10 carbon atoms, cycloalkylene groups having 4 to 8 carbon atoms, —O—, —S—, and —SO$_2$—, or represents direct combination of benzene rings; R$_1$ and R$_2$ are each a halogen atom or an alkyl group having 1 to 12 carbon atoms, l and m are each an integer of 0 to 1; and p is 0 or 1. The dihydric phenol includes, for example, bisphenol A, bis-(4-hydroxyphenyl)methane, bis-(4-hydroxy-3-methylphenyl) propane, resorcinol, etc. These compounds can be used alone or in combination of two or more thereof. Multiblock copolymers, whose aromatic polyester (e.g. polybutylene terephthalate) regions are made hard segment components and whose aliphatic polyester (e.g. polytetramethyleneglycol) regions are made soft segment components, can be used. Various grades are available, depending on kinds, ratio and differences in the molecular weight of hard segments and soft segments. They include, for example, Hitrel (tradename of a product commercially available from DuPont-Toray Co., Ltd., Japan), Perplen (tradename of a product commercially available from Toyobo Co., Ltd., Japan), etc.

Polyamide-based elastomer can be classified into two major types i.e. polyether block amide type having polyamide as a hard phase and polyether or polyester as a soft phase and polyether-ester block type, polyamide for this purpose includes polyamide-6, polyamide-6, polyamide-11, polyamide-12, etc., and polyether for this purpose includes polyoxyethylene, polyoxypropylene, polytetramethyleneglycol, etc. Specifically, the polyamide-based elastomer includes UBE Polyamide Elastomer (tradename of a product commercially available from Ube Industries, Ltd., Japan), Diamid (tradename of a product commercially available from Daicel-Hüls Co., Ltd., Japan), Glyron ELY (tradename of a product commercially available Ames Japan, Ltd., Japan), Nopamid (tradename of a product commercially available from Mitsubishi Chemical Corp., Japan), Glylax (tradename of a product commercially available from Dainippon Ink and Chemicals, Inc., Japan), etc.

Acrylic elastomer is composed of acrylate ester as the main component such as ethyl acrylate, butyl acrylate, methoxyethyl acrylate, ethoxyethyl acrylate, etc., and also of a crosslinking site monomer such as glycidyl methacrylate, alkylglycidyl ether, etc. Furthermore, it can be copolymerized with acrylonitrile or ethylene. Specifically, the acrylic elastomer includes acrylonitrile-butyl acrylate copolymer, acrylonitrile-butyl acrylate-ethyl acrylate copolymer, acrylonitrile-butyl acrylate-glycidyl methacrylate copolymer, etc.

Silicone-based elastomer is composed of organopolysiloxane as the main component and can be divided into polydimethylsiloxane-based elastomer, polymethylphenylsiloxane-based elastomer and polydiphenylsiloxane-based elastomer. It can be partially modified by a vinyl group, an alkoxy group, etc. Specifically, the silicone-based elastomer includes KE series (tradenames of products commercially available from Shin-Etsu Chemical Co., Ltd., Japan), SE series, CY series and SH series (all the foregoing are tradenames of products commercially available from Toray-Dow Corning Silicone Co., Ltd., Japan), etc.

Besides the said thermoplastic elastomers, rubber-modified epoxy resins can be used. Rubber-modified epoxy resins can be obtained by modifying parts or all of the epoxy groups of the said bisphenol F type epoxy resin, bisphenol A type epoxy resin, salicylaldehyde type epoxy resin, phenol novolak type epoxy resin or cresol novolak type epoxy resin with, for example, butadiene-acrylonitrile rubber modified with carboxyl groups at both ends, terminal amino-modified silicone rubber, etc. Among these elastomers, butadiene-acrynitrile copolymers modified with carboxyl groups at both ends, Espel, which is a polyester-based elastomer having hydroxyl groups (Espel 1612 and 1620, tradenames of products commercially available from Hitachi Chemical Co., Ltd., Japan) are preferable from the viewpoint of adhesive shear strength.

Mixing proportion of elastomer (B) is 2–50 parts by weight, preferably 2 to 30 parts by weight, more preferably 4 to 20 parts by weight on the basis of 100 parts by weight of acid-modified, vinyl group-containing epoxy resin (A). Below 2 parts by weight, the elastic modulus of cured film in the high temperature region tends to be not lowered, whereas above 50 parts by weight the light-unexposed regions tend to be insoluble in a developing solution.

Photopolymerization initiator (C) for use in the present invention includes, for example, benzoins such as benzoin, benzoin methyl ether, benzoin isopropyl ether, etc.; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenyl ketone, 2-methyl-1-[4-(methylthio)-phenyl]-2-morpholino-1-propane, N,N-dimethylamino acetophenone, etc.; anthraquinones such as 2-methylanthraquinone, 2-ethylanthraquinone, 2-tert-butylanthraquinone, 1-chloroanthraquinone, 2-anylanthraquinone, 2-aminoanthraquinone, etc.; thioxanthones 2,4-dimethylthoxanthone, 2,4-diethylthixoanthone, 2-chlorothioxanthone, 2,4-diisopropylthioxanthone, etc.; ketals such as acetophenonedimethylketal, benzyldimethylketal, etc.; benzophenes such as benzophenone, methylbenzophenone, 4,4'-dichlorobenzophenone, 4,4'-bisdiethylaminobenzophenne, Michler's ketone, 4-benzoyl-4'-methyl-diphenyl sulfide, etc.; 2,4,6-trimethylbenzoyldiphenyl-phosphine oxide, etc. These compounds can be used alone or in combination of two or more thereof.

Furthermore, a photopolymerization initiation promoter such as tertiary amines, for example, ethyl N,N-dimethylaminobenzoate, isoamyl N,N-dimethylaminobenzoate, pentyl-4-dimethyl aminobenzoate, triethylamine, trethanolamine, etc. can be used alone or in combination of two or more thereof.

The amount of photopolymerization initiator (c) contained in the present photo polymerizable resin composition is preferably 0.5 to 20 parts by weight, more preferably 2 to 15 parts by weight, on the basis of 100 parts by weight of photo polymerizable resin composition. Below 0.5 parts by weight, the exposed regions tend to be dissolved during the development, whereas above 20 parts by weight the heat resistance tends to be lowered.

Diluent (D) for use in the present invention includes, for example, an organic solvent and/or a photopolymerizable monomer. The organic solvent includes, for example, ketone such as ethyl methyl ketone, cyclohexanone, etc.; aromatic hydrocarbons such as toluene, xylene, tetramethylbenzene, etc.; glycol ethers such as methyl cellosolve, butyl cellosolve, methyl carbitol, butyl carbitol, propyleneglycol monomethyl ether, dipropyleneglycol monoethyl ether, dipropyleneglycol diethyl ether, triethyleneglycol monoethyl ether, etc.; esters such as ethyl acetate, butyl acetate, butyl cellosolve acetate, carbitol acetate, etc.; aliphatic hydrocarbons such as octane, decane, etc.; and petroleum solvents such as petroleum ether, petroleum naphtha, hydrogenated petroleum naphtha, solvent naphtha, etc.

The photopolymerizable monomer includes, for example, hydroxyalkyl (meth)acrylates such as 2-hydroxyethyl (meth)acrylate, 2-hydroxypropyl (meth)acrylate, etc.; glycol mono or di(meth)acrylates such as ethyleneglycol, methoxytetraethyleneglycol, polyethyleneglycol, etc.; (meth)acrylamides such as N,N-dimethyl (meth)acrylamide, N-methylol (meth)acrylamide, etc.; aminoalkyl (meth) acrylates such as N,N-dimethylaminoethyl (meth)acrylate, etc.; polyhydric alcohol such as hexanediol, trimethylolpropane, pentaerythritol, ditrimethylolpropane, dipentaerythritol, tris-hydroxyethyl isocyanurate, etc. or polyhyric (meth)acrylates of their ethylene oxide or propylene oxide adducts; (meth)acrylates of ethylene oxide or propylene oxide adduct of phenols, such as phenoxyethyl (meth)acrylate, etc. such as phenoxyethyl (meth)acrylate, etc.; (meth)acrylates of glycidyl ether such as glycerine diglycidyl ether, trimethylolpropane triglycidyl ether, triglycidyl isocyanurate, etc., and melamine (meth)acrylate, etc.

The present diluent (D) can be used alone or in combination of two or more thereof. The amount of diluent (D) contained in the photo curable resin composition is preferably 5 to 80 parts by weight, more preferably 10 to 70 parts by weight, on the basis of 100 parts by weight of the photo curable resin composition. Below 5 parts by weight the light-exposed regions tend to be dissolved during the development with a low photosensitivity, whereas above 80 parts by weight the heat resistance tends to be lowered.

Curing agent (E) for use in the present invention is preferably compounds, which are curable per se by heat, ultraviolet ray, etc., or compounds which are curable together with the carboxyl groups and hydroxyl groups of acid-modified, vinyl group-containing epoxy resin (A), i.e. photo curable resin component in the present composition, by heat, ultraviolet ray, etc. By use of the curing agent, the heat resistance, adhesibility, chemical resistance, etc. of the ultimate cured film can be improved. Curing agent (E) for this purpose includes, for example, thermosetting compounds such as epoxy compounds, melamine compounds, urea compounds, oxazoline compounds, etc. Epoxy compounds include, for example, bisphenol A type epoxy resin, bisphenol F type epoxy resin, hydrogenated bisphenol A type epoxy resin, brominated bisphenol A type epoxy resin, novolak type epoxy resin, bisphenol S type epoxy resin, biphenyl type epoxy resin or heterocyclic epoxy resin of triglycidyl isocyanurate, etc., and bixylenol type epoxy resin, etc. Melamine compounds include, for example, triaminotriazine, hexamethoxysilane, hexabutoxylated melamine, etc. The urea compounds include, for example, dimethylol urea, etc.

The present curing agent (E) can be used alone or in combination of two or more thereof. The amount of curing agent (E) contained in the photo curable resin composition is preferably 2 to 50 parts by weight, more preferably 10 to 40 parts by weight, on the basis of 100 parts by weight of the photo curable resin composition. Below 2 parts by weight, the heat resistance of ultimate cured film tends to be lowered, whereas above 50 parts by weight the developability tends to be lowered.

To further improve various characteristics such as heat resistance, adhesibility, chemical resistance, etc. of ultimate cured film, the present photo curable resin composition can contain an epoxy resin curing agent.

Specifically, the epoxy resin curing agent includes imidazole derivatives such as 2-methylimidazole, 2-ethyl-4-methylimidazole, 1-benzyl-2-methylimdazole, 2-phenylimidazole, 2-phenyl-4-methyl-5-hydroxymethylimidazole, etc.; quanamines such as acetoguanamine, benzoguanamine, etc.; polyamines such as diaminodiphenylmethane, m-phenylenediamine, m-xylenediamine, diaminodiphenylsulfone, dicyandiamide, urea, urea derivative, melamine, polybasic hydrazide, etc.; their organic acid salts and/or epoxy adducts; amine complex of boron trifluoride; triazine derivatives such as ethyldiamino-S-triazine, 2,4-diamino-S-triazine, 2,4-diamino-6-xylyl-S-triazine, etc.; tertiary amines such as trimethylamine, triethanolamine, N,N-dimethyloctylamine, N-benzyldimethylamine, pyridine, N-methylmorpholine, hexa(N-methyl)melamine, 2,4,6-tris(dimethylaminophenol), tetramethylguanidine, m-amiophenol, etc.; polyphenols such as polyvinylphenol, polyvinylphenol bromide, phenol novolak, alkylphenol novolak, etc.; organic phosphines such as tributylphosphine, triphenyl phosphine, tris-2-cyanoethylphosphine, etc.; phosphonium salts such as tri-n-butyl(2,5-dihydroxyphenyl)-phosphonium bromide, hexadecyltributylphosphonium chloride, etc.; quaternary ammonium salts such as benzyltrimethylammonium chloride, phenyltributylammonium chloride, etc.; the said polybasic acid anhydrides; diphenyliodonium tetrafluoroborate, triphenylsulfonium hexafluoroantimonate, 2,4,6-triphenylthiopyrilium hexafluorophosphate, etc.

The epoxy resin curing agent can be used alone or in combination of two or more thereof. The amount of epoxy resin curing agent contained in the photo curable resin composition is preferably 0.01 to 20 parts by weight, more preferably 0.1 to 10 parts by weight, on the basis of 100 parts by weight of the photo curable resin composition.

To further improve various characteristics such as adhesibility, coating film hardness, etc., the present photo curable resin composition can further contain, if required, well known inorganic fillers alone or in combination of two or more thereof, such as barium sulfate, barium titanate, silica, talc, fired kaolin, magnesium carbonate, aluminum oxide, aluminum hydroxide, mica, etc. The amount of the filler is preferably 2 to 80 parts by weight, more preferably 5 to 50 parts by weight, on the basis of 100 parts by weight of the photo curable resin composition.

The present photo curable resin composition can further contain, if required, various well known additives of ordinary use such as a coloring agent, e.g. phthalocyanin blue, phthalocyanin green, Iodine blue, Disazo yellow, Crystal violet, titanium oxide, carbon black, naphthalene black, etc., a polymerization inhibitor, e.g. hydroquinone, methyl hydroquinone, hydroquinone monomethyl ether, catechol, pyrogallol, etc., a thickener, e.g. benton, montmorillonite, etc., silicone-based, fluorine-based and vinyl resin-based defoamers, a silane coupling agent, etc. Furthermore, a brominated epoxy compound, an acid-modified, brominated epoxy compound, an antimony compound, and phosphorus compounds such as phosphate compounds, aromatic condensed phosphate esters, halogen-containing, condensed phosphate esters, etc. can be used as a flame retarder.

The present photo curable resin composition can be obtained by uniformly kneading and mixing formula components through a roll mill, bead mill, etc.

The present photo curable resin composition can be used in the production of cured coating film upon pattern formation as in the following manner; i.e. by coating a copper-lined laminate board with the present resin composition to a film thickness of 10 to 200 $\mu$m by screen printing, spraying, roll coating, curtain coating, electrostatic coating or the like, then by drying the coating film at 60° to 110° C., and contacting the film with a negative film directly (or indirectly through a transparent film), followed by irradiation of actinic beam (e.g. ultraviolet ray) preferably at 10 to 1,000 mJ/cm$^2$, successive removal of light-unexposed regions through dissolution into a dilute aqueous alkali solution or an organic solvent, and post-exposure of the light-exposed regions to light (ultraviolet ray) and/or post-heating, thereby obtaining a thoroughly cure film. The post-exposure to light is carried out preferably at 1 to 5 mJ/cm$^2$ and the post-heating is carried out preferably at 100° to 200° C. for 30 minutes to 12 hours.

Furthermore, a photosensitive element can be made by laminating a layer of the present photo curable resin composition on a support, where the layer of the photo curable resin composition has preferably a thickness of 10 to 100 $\mu$m. Preferable support is a film having a thickness of 5 to 100 $\mu$m of polyethylene terephthalate, or the like. The layer of the photo curable resin composition can be formed by applying a solution of the present photo curable resin composition to a support film, followed by drying.

PREFERRED EMBODIMENTS OF THE INVENTION

The present invention will be described in detail below, referring to Synthesis Examples, Examples and Comparative Examples, but will be not limited thereto. Throughout Synthesis Examples, Examples and Comparative Examples, parts are by weight.

SYNTHESIS EXAMPLE 1

220 Parts of YDCN 704 (cresol novolak type epoxy resin, which corresponded to the said formula (I), where X=glycidyl and R=methyl and was commercially available from Tohto Kasei Co., Ltd., Japan) were admixed with 72 parts of acrylic acid, 1.0 parts of hydroquinone and 180 parts of carbitol acetate, followed by heating at 90° C. with stirring to dissolve the reaction mixture. Then, the reaction mixture was cooled to 60° C. and one part of benzyltrimethylammonium chloride were added thereto. Then, the reaction mixture was subjected to reaction with heating to 100° C. until the acid value of solids reached 1 mgKOH/g. Then, 152 parts of tetrahydrophthalic anhydride and 100 parts of carbitol acetate were added thereto, and the reaction mixture was subjected to reaction with heating to 80° C. for about 6 hours, and then cooled, and diluted with carbitol acetate so that the solid concentration could be 60%, whereby acid-modified, vinyl group-containing epoxy resin (I) was obtained.

SYNTHESIS EXAMPLE 2

330 Parts of EPPN5O2H (salicylaldehyde type epoxy resin, which corresponded to the said formula (III), where X=glycidyl and was commercially available from Nippon Kayaku Co., Ltd., Japan) were admixed with 144 parts of acrylic acid, 1.5 parts of hydroquinone and 250 parts of carbitol acetate, followed by heating to 90° C. with stirring to dissolve the reaction mixture. Then, the reaction mixture was cooled to 60° C., and two parts of benzyltrimethylammonium chloride were added thereto. Then, the reaction mixture was subjected to reaction with heating to 100° C. until the acid value reached 1 mgKOH/g, then cooled and diluted with carbitol acetate so that the solid concentration could be 60%, whereby acid-modified, vinyl group-containing epoxy resin (II) was obtained.

SYNTHESIS EXAMPLE 3

330 Parts of EPPN502H (salicylaldehyde type epoxy resin, which corresponded to the said formula (III), where X=glycidyl) and was commercially available from Nippon Kayaku Co., Ltd., Japan) were admixed with 144 parts of acrylic acid, 1.5 parts of hydroquinone and 250 parts of carbitol acetate, followed by heating to 90° C. with stirring to dissolve the reaction mixture. Then, the reaction mixture was cooled to 60° C., admixed with 2 parts of benzyltrimethylammonium chloride and subjected to reaction with heating to 100° C. until the acid value reached 1 mgKOH/g. Then, the reaction mixture was admixed with 230 parts of tetrahydrophthalic anhydride and 180 parts of carbitol acetate, subjected to reaction with heating to 80° C. for about 6 hours, then cooled and diluted with carbitol acetate so that the solid concentration could be 60%, whereby acid-modified, vinyl group-containing epoxy resin (III) was obtained.

SYNTHESIS EXAMPLE 4

475 Parts of YDF2001 (bisphenol F type epoxy resin, which corresponded to the said formula (II), where X=glycidyl and R=H, and was commercially available from Tohto Kasei Co., Ltd., Japan) were admixed with 72 parts of acrylic acid, 0.5 part of hydroquinone and 120 parts of carbitol acetate and heated to 90° C. with stirring to dissolve the reaction mixture. Then, the reaction mixture was cooled to 60° C., admixed with 2 parts of benzyltrimethylammonium chloride and subjected to reaction with heating to 100° C. until the acid value reached 1 mgKOH/g. Then, the reaction mixture was admixed with 98 parts of maleic anhydride and 85 parts of carbitol acetate, subjected to reaction with heating to 80° C. for about 6 hours, then cooled and diluted with carbitol acetate so that the solid concentration could be 60%, whereby acid-modified, vinyl group-containing epoxy resin (IV) was obtained.

EXAMPLES 1 TO 6 AND COMPARATIVE EXAMPLES 1 TO 4

Compositions were formulated according to blend formulae given in the following Tables 1 and 2 and kneaded through a three-roll mill to prepare photo curable resin compositions. The resin compositions were applied to respective copper-lined laminates by screen printing through a 120-mesh Tetron screen to a thickness of about 30 $\mu$m (after drying) and dried in a hot air-circulating drier at 80° C. for 30 minutes. Then, a negative type mask of desired pattern was tightly laid onto the respective coating films, followed by light exposure at 500 mJ/cm$^2$, using an ultraviolet irradiator. Then, the light-exposed coating films were spray developed with an aqueous 1% sodium carbonate solution or a chlorocene solvent under pressure of 1.8 kgf/cm$^2$ for 60 seconds, thereby dissolving the light-unexposed regions. Developability and photosensitivity were evaluated on the basis of the thus obtained patterns. Then, the developed coated laminates were heated at 150° C. for one hour to prepare test pieces, which were tested to determine the adhesibility, solvent resistance, acid resistance, alkali resistance, solder heat resistance and adhesive shear strength, which will be defined below. Coating films peeled off from the substrates (copper-lined laminates) were also tested for dynamic viscoelasticity. Results of evaluation are shown in the following Tables 1 and 2.

Figure 1:
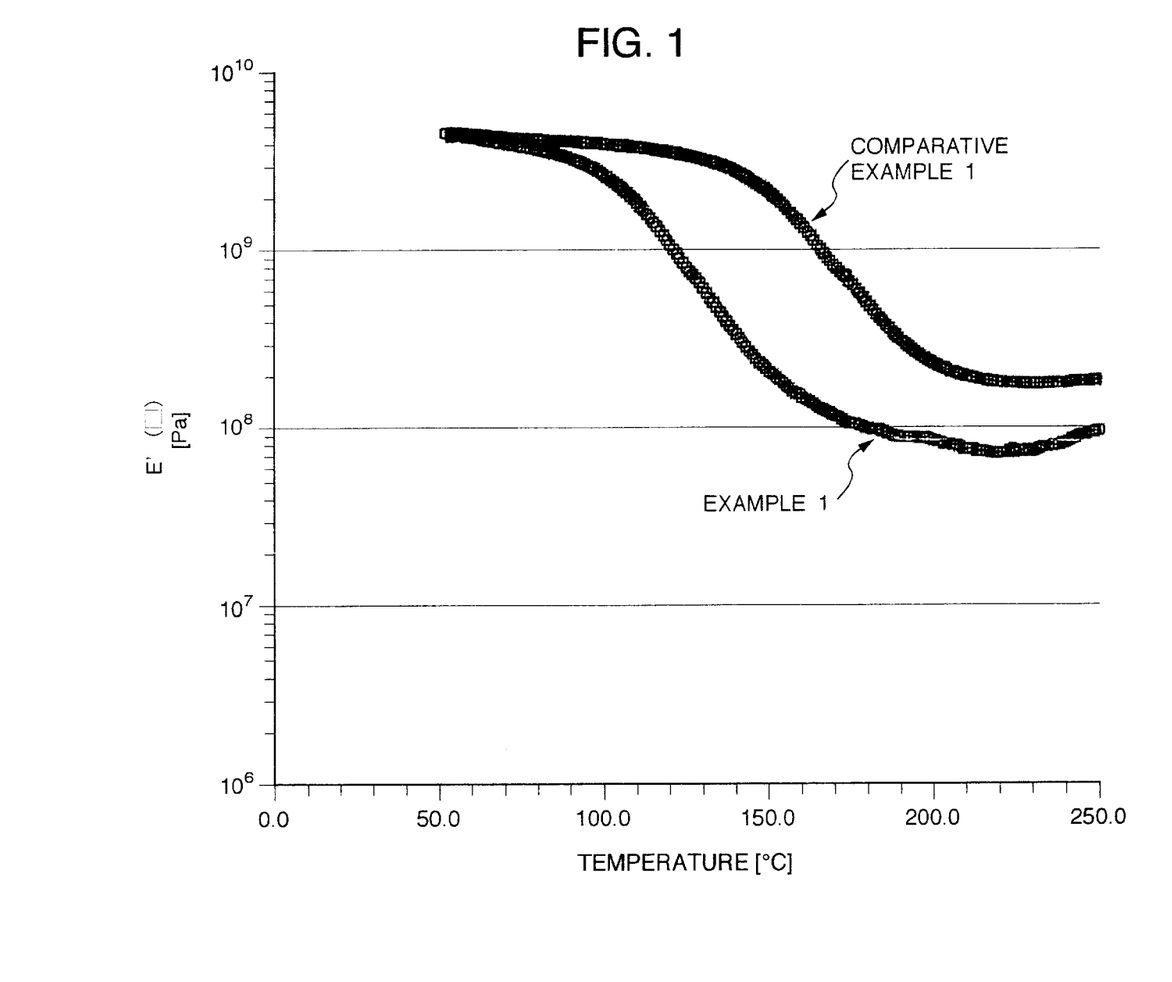
FIG. 1 is a graph showing results of visco-elasticity of coating film obtained in Example 1 and Comparative Example 1.

Test and evaluation procedures are as follows and results of viscoelasticity determination of coating films prepared in Example 1 and Comparative Example 1 are shown in FIG. 1.

[Photosensitivity] Test piece was cross-cut to 100 squares with sizes of 1 mm×1 mm and subjected to peeling test with a cellophane tape according to JIS K5400. Peeling states of cross-cut squares were visually observed and evaluated according to the following evaluation standard:

o . . . 90/100 or more

Δ . . . 50/100 to less than 90/100 x . . . 0/100 to less than 50/100

[Solvent resistance] Test piece was dipped in isopropyl alcohol at room temperature for 30 minutes, and confirmation of the presence or absence of abnormal appearance, followed by peeling tests with a cellophane tape.

o . . . Absence of abnormal appearance of coated film with no peeling x . . . Presence of abnormal appearance of coating film or occurrence of peeling

[Acid resistance] Test piece was dipped in an aqueous 10% hydrochloric acid solution at room temperature for 30 minutes, and confirmation of the presence or absence of abnormal appearance, followed by peeling tests with a cellophane tape.

o . . . Absence of abnormal appearance of coating film with no peeling x . . . Presence of abnormal appearance of coating film or occurrence of peeling

[Alkali test] Test piece was dipped in an aqueous 5% sodium hydroxide solution at room temperature for 30 minutes and confirmation of presence or absence of abnormal appearance, followed by peeling tests with a cellophane tape.

o . . . Absence of abnormal appearance of coating film with no peeling.

x . . . Presence of abnormal appearance of coating film or occurrence of peeling.

[Solder heat resistance] Test piece was coated with a rosin-based flux or water-soluble flux and dipped in a solder vat at 260° C. for 10 seconds, with these operations being made one cycle. After repetition of 6 cycles, the appearance of coating film was visually observed.

o . . . Absence of abnormal appearance (peeling and swelling) of coating film without any occurrence of solder intrusion x . . . Presence of abnormal appearance (peeling and swelling) of coating film or occurrence of solder intrusion

[Adhesive shear strength] An encapsulant (CEL9200, tradename of a product commercially available from Hitachi Chemical Co., Ltd., Japan) in a conical shape, 3.6 mm in diameter and 4 mm high, was molded onto test piece and adhesiveness was evaluated, after moisture absorption, at test temperature of 245° C. by a bond tester (commercially available from Dage Co., Ltd.).

[Heat shock test] Test piece was subjected to thermal hysteresis of 1,000 cycles, −55° C./30 minutes and 125° C./30 minutes being made one cycle, and then was visually or microscopically observed.

o . . . No occurrence of cracks x . . . Occurrence of cracks

[Dynamic viscoelasticity] Dynamic viscoelasticity was measured at a vibration frequency of 1 $H_3$ (6.28 rad/sec) with a solid analyzer RSAII (commercially available from Rheometrics Co., Ltd.) under the conditions of strain of 0.15%, mode of Static Force Tracking Dynamic Force and initial static force of 15.0 gm. Sample with such size as 22.5 long, 3.0 wide and 0.06 mm thick was determined for viscoelasticity at 220° C. while elevating the measurement temperature from 40° C. to 250° C. at a temperature elevation rate of 5° C./min.

TABLE 1

| Item | Example 1 | Example 2 | Example 3 | Example 4 | Example 5 | Example 6 |
|---|---|---|---|---|---|---|
| Photo curable resin (I) obtained in Syn. Ex. 1 | 45 | 43 | 48 | — | — | — |
| Photo curable resin (II) obtained in Syn. Ex. 2 | — | — | — | 45 | — | — |
| Photo curable resin (III) obtained in Syn. Ex. 3 | — | — | — | — | 40 | — |
| Photo curable resin (IV) obtained in Syn. Ex. 4 | — | — | — | — | — | 45 |
| Espel 1612*[1] | 13 | | | 12 | | 13 |
| Espel 1620*[2] | | 13 | | | 15 | |
| XER-91*[3] | | | 5 | | | |
| EPIKOTE 828*[4] | 13 | 12 | 12 | 13 | 13 | 12 |
| Kayarad DPHA*[5] | 6 | 6 | 7 | 5 | 6 | 6 |
| IRGACURE 907*[6] | 4.5 | 4.5 | 4.5 | 4.5 | 4.5 | 4.5 |
| Kayacure DETX-S*[7] | 0.8 | 0.8 | 0.8 | 0.8 | 0.8 | 0.8 |
| Phthalocyanin green | 1.5 | 1.5 | 1.5 | 1.5 | 1.5 | 1.5 |
| Melamine | 4 | 4 | 4 | 4 | 5 | 3 |
| Silica | 16 | 16 | 16 | 16 | 16 | 15 |
| Barium sulfate | 20 | 20 | 20 | 18 | 18 | 20 |
| Phtosensitivity | o | o | o | o | o | o |
| Acid resistance | o | o | o | o | o | o |
| Alkali resistance | o | o | o | o | o | o |
| Solvent resistance | o | o | o | o | o | o |
| Adhesiblity | o | o | o | o | o | o |
| Solder heat resistance (rosin-based) | o | o | o | o | o | o |
| Solder heat resistance (water-soluble flux) | o | o | o | o | o | o |
| Adhesive shear strength (Kgf/mm², after moisture absorption) | 0.77 | 0.56 | 0.60 | 0.61 | 0.65 | 0.74 |
| Heat shock resistance | o | o | o | o | o | o |
| Dynamic viscoelasticity (MPa) | 70 | 35 | 75 | 45 | 50 | 60 |
| Remark | Alkali development | Alkali development | Alkali development | Solvent development | Alkali development | Alkali development |

*[1]Espel 1612: Polyester-based elastomer having hydroxy groups (commercially available from Hitachi Chemical Co., Ltd., Japan)
*[2]Espel 1620: Polyester-based elastomer having hydroxy groups (commercially available from Hitachi Chemical Co., Ltd., Japan)
*[3]XER-91: Butdiene-acrylonitrile copolymer modified with carboxyl groups at both ends (commercially available from Japan Synthetic Rubber Co., Ltd., Japan)
*[4]Epikote 828: Bisphenol A type epoxy resin (commercially available from Yuka-Shell Epoxy K.K., Japan)
*[5]Kayarad DHPA: Dipentaerythritol pentacrylate (commercially available from Nippon Kayaku Co., Ltd., Japan)
*[6]Irgacure 907: 2-methyl-[4-(methylthio)phenyl] morpholino-1-propane (commercially available from Ciba-Geigy A.G.)
*[7]Kayacure DETX-S: 2,4-diethylthioxanthone (commercially available from Nippon Kayaku Co., Ltd., Japan)

TABLE 2

| Item | Comp. Example 1 | Comp. Example 2 | Comp. Example 3 | Comp. Example 4 |
|---|---|---|---|---|
| Photo curable resin (I) obtained in Syn. Ex. 1 | 57 | — | — | — |
| Photo curable resin (II) obtained in Syn. Ex. 2 | — | 56 | — | — |
| Photo curable resin (III) obtained in Syn. Ex. 3 | — | — | 55 | — |
| Photo curable resin (IV) obtained in Syn. Ex. 4 | — | — | — | 57 |
| EPIKOTE 828*[4] | 13 | 14 | 12 | 15 |
| Kayarad DPHA*[5] | 6 | 6 | 7 | 5 |
| IRGACURE 907*[6] | 45 | 4.5 | 4.5 | 4.5 |
| Kayacure DETX-S*[7] | 0.8 | 0.8 | 0.8 | 0.8 |
| Phthalocyanin green | 1.5 | 1.5 | 1.5 | 1.5 |
| Melamine | 4 | 4 | 4 | 4 |
| Silica | 16 | 17 | 15 | 16 |
| Barium sulfate | 20 | 20 | 20 | 18 |
| Photosensitivity | ○ | ○ | ○ | ○ |
| Acid resistance | ○ | ○ | ○ | ○ |
| Alkali resistance | ○ | ○ | ○ | ○ |
| Solvent resistance | ○ | ○ | ○ | ○ |
| Adhesibility | ○ | ○ | ○ | ○ |
| Solder heat resistance (rosin-based) | ○ | ○ | ○ | ○ |
| Solder heat resistance (water-soluble flux) | ○ | ○ | ○ | ○ |
| Adhesive shear strength (Kgf/mm², after moisture absorption) | 0.20 | 0.15 | 0.23 | 0.18 |
| Heat shock resistance | x | x | x | x |
| Dynamic viscoelasticity (MPa) | 200 | 450 | 550 | 300 |
| Remark | Alkali development | Solvent development | Alkali development | Solvent development |

*[1]Epikote 828: Bisphenol A type epoxy resin (commercially available from Yuka-Shell Epoxy K.K., Japan)
*[2]Kayarad DPHA: Dipentaerythritol pentacrylate (commercially available from Nippon Kayaku Co., Ltd., Japan)
*[3]Irgacure 907: 2-methyl-[4-(methylthio)phenyl] morpholino-1-propane (commercially available from Ciba-Geigy A.G.)
*[4]Kayacure DETZ-S:2,4-diethylthioxanthone (commercially available from Nippon Kayaku Co., Ltd., Japan)

According to the present invention, there can be provided a photo curable resin composition capable of giving a high performance cured film having distinguished heat resistance, humidity-heat resistance (adhesive shear strength), adhesibility, mechanical characteristics and electrical characteristics and suitable for use in the production of printed wiring boards, high density multilayered boards, semiconductor packages, etc., and also a photosensitive element.

What is claimed is:

1. A photo curable resin composition, which comprises (A) an epoxy resin modified by a vinyl group-containing monocarboxylic acid, (B) an elastomer, (C) a photopolymerization initiator, (D) a diluent and (E) a curing agent, wherein the elastomer (B) is contained in an amount of 2 to 50 parts by weight per 100 parts by weight of the modified epoxy resin (A), and wherein the elastomer (B) is at least one member selected from the group consisting of styrene-based elastomers, olefinic elastomers, urethane-based elastomers, polyester-based elastomers, polyamide-based elastomers, acrylic elastomers, and silicone-based elastomers.

2. A photo curable resin composition according to claim 1, where in the modified epoxy resin (A) is a reaction product (A") obtained by reacting an epoxy resin with a vinyl group-containing monocarboxylic acid, followed by further reaction with a saturated group or unsaturated group-containing polybasic acid anhydride.

3. A photo curable resin composition comprising (A) an epoxy resin modified by a vinyl group-containing monocarboxylic acid, (B) an elastomer, (C) a photopolymerization initiator, (D) a diluent and (E) a curing agent, wherein the elastomer (B) is contained in an amount of 2 to 50 parts by weight per 100 parts by weight of the modified epoxy resin (A), and wherein the elastomer (B) is a rubber-modified epoxy resin.

4. A photo curable resin composition, which comprises a polymer alloy (A) an epoxy resin modified by a vinyl group-containing monocarboxylic acid, and (B) an elastomer, said composition providing cured film having an elastic modulus of 1 to 100 MPa in dynamic visco-elasticity measurement in a region of 200° to 220° C., wherein the elastomer (B) is at least one member selected from the group consisting of styrene-based elastomers, olefinic elastomers, urethane-based elastomers, polyester-based elastomers, polyamide-based elastomers, acrylic elastomers, and silicone-based elastomers.

5. A photo curable resin composition according to claim 4, wherein the elastomer (B) is contained in an amount of 2 to 50 parts by weight per 100 parts by weight of the modified epoxy resin (A).

6. A photo curable resin composition according to claim 4, wherein the modified epoxy resin (A) is a reaction product (A") obtained by reacting an epoxy resin with a vinyl group-containing monocarboxylic acid, followed by further reaction with a saturated group or unsaturated group-containing polybasic acid anhydride.

7. A photo curable resin composition, which comprises (A) an epoxy resin modified by a vinyl group-containing monocarboxylic acid, and (B) an elastomer, wherein the elastomer (B) is contained in an amount of 2 to 50 parts by weight per 100 parts by weight of the modified epoxy resin (A), and wherein the elastomer (B) is at least one member selected from the group consisting of styrene-based elastomers, olefinic elastomers, urethane-based elastomers, polyester-based elastomers, polyamide-based elastomers, acrylic elastomers, and silicone-based elastomers.

8. A photo curable resin composition according to claim 7, wherein the modified epoxy resin (A) is a reaction product (A") obtained by reacting an epoxy resin with a vinyl group-containing monocarboxylic acid, followed by further reaction with a saturated group or unsaturated group-containing polybasic acid anhydride.

9. A photo curable resin composition, which comprises (A) an epoxy resin modified by a vinyl group-containing monocarboxylic acid, (B) an elastomer, (C) a photopolymerization initiator, (D) a diluent and (E) a curing agent, said resin composition providing a cured film polymer alloy having an elastic modulus of 1 to 100 MPa in dynamic visco-elasticity measurement in a region or 200° to 220° C., wherein (A) and (B) form a polymer alloy wherein the elastomer (B) is contained in an amount of 2 to 50 parts by weight per 100 parts by weight of the modified epoxy resin (A), and wherein said epoxy resin is cresol novolak epoxy resin modified with acrylic acid and further with tetrahydrophthalic anhydride, and the elastomer is butadiene-acrylonitrile copolymer modified with carboxyl groups at both ends.

* * * * *